United States Patent
Tsai et al.

(10) Patent No.: US 8,664,516 B2
(45) Date of Patent: Mar. 4, 2014

(54) STRUCTURE AND METHOD OF SOLAR CELL EFFICIENCY IMPROVEMENT BY STRAIN TECHNOLOGY

(75) Inventors: Jyun-Jhe Tsai, Taipei (TW); Ying-Jhe Yang, Taipei (TW); Chee Wee Liu, Taipei (TW)

(73) Assignee: National Taiwan University, Taipei (TW)

( * ) Notice: Subject to any disclaimer, the term of this patent is extended or adjusted under 35 U.S.C. 154(b) by 899 days.

(21) Appl. No.: 12/416,369

(22) Filed: Apr. 1, 2009

(65) Prior Publication Data

US 2010/0024870 A1   Feb. 4, 2010

(30) Foreign Application Priority Data

Jul. 31, 2008 (TW) ............................... 97129141 A

(51) Int. Cl.
*H01L 31/0203* (2006.01)
(52) U.S. Cl.
USPC ........... 136/251; 136/244; 136/259; 136/256; 438/57; 438/64

(58) Field of Classification Search
USPC ........ 136/249–251, 256, 252; 438/57, 64, 71, 438/78, 81
See application file for complete search history.

(56) References Cited

U.S. PATENT DOCUMENTS

| 7,012,188 B2 * | 3/2006 | Erling | 136/251 |
| 2003/0228727 A1 * | 12/2003 | Guerra | 438/200 |
| 2004/0182431 A1 * | 9/2004 | Zuppero et al. | 136/243 |
| 2007/0295390 A1 * | 12/2007 | Sheats et al. | 136/251 |

* cited by examiner

*Primary Examiner* — Jayne Mershon

(57) ABSTRACT

A structure and a method of the solar cell efficiency improvement by the strain technology are provided. The solar cell has a first surface and a second surfaces which at least a gasket is disposed thereon for supporting the solar cell and being the axle whiling stressing. The method includes the steps of: (a) applying at least a stress on the first surface; (b) generating a supporting force on the second surface; and (c) generating at least a strain in the solar cell. In addition, the present invention also includes a method involving a step of: (a) applying a mechanical stress to the solar cell; (b) generating a tension in the solar cell by at least two materials having different lattice constants; or (c) generating another tension in the solar cell by a shallow trench isolation filler, a high tensile/compressive stress silicon nitride layer and a combination thereof.

7 Claims, 5 Drawing Sheets

STRUCTURE AND METHOD OF SOLAR CELL EFFICIENCY IMPROVEMENT BY STRAIN TECHNOLOGY

FIELD OF THE INVENTION

The present invention relates to a structure and a method of the solar cell efficiency improvement. In particular, the present invention relates to a structure and a method of the solar cell efficiency improvement by the strain technology.

BACKGROUND OF THE INVENTION

Since fossil fuel, which is the material humans depend on to obtain energy, might be drained out in the twenty-first century, and leads to the increased price of fossil fuel. Therefore, every country takes efforts on developing new energy resources in the recent years, including solar energy, wind power, water power, biomass power and newly-explored fossil fuel storage sources, etc. Among these, solar energy which is radiated from the sun is deemed as the clear energy without generating greenhouse gases or aggravating the greenhouse effect, and has great benefit on resolving the energy requirement and decreasing carbon dioxide emission.

The present solar cells apply various materials, including single crystalline silicon, polycrystalline silicon and amorphous silicon, to form solar cells. Among these, the polycrystalline silicon is composed of numerous different single crystalline silicons separated by grain boundaries. Due to the mechanical properties of polycrystal, the cutting and manufacturing procedures of the polycrystalline silicon are more difficult than those of the single crystalline silicon and the amorphous silicon. The efficiency of the polycrystalline silicon solar cell is lower than that of single crystalline silicon solar cell, and the polycrystalline silicon is suitable for the low-efficient electrical power application system. In addition to adapting the silicon material, other semiconductor materials can be adapted to manufacture the solar cell, such as cadmium telluride (CdTe), gallium arsenide (GaAs), indium gallium arsenide (InGaAs) or other III-V group compounds.

All the present solar cell research fellows devote to improve the photoelectric conversion efficiency of the solar cells. For instance, the electrode is manufactured as the finger-shaped, for increasing the incident light area ratio; the surface of the solar cell is manufactured as the pyramid structure and the anti-refection layer is added, for increasing the light trapping and reducing the light reflection; the metal electrode is buried into the substrate for decreasing the series resistance; and the electrodes of the solar cell are manufactured on the identical surface to form the point-connected solar cell, for increasing the incident area and welding easily. The above-mentioned manufacturing processes for the solar cell efficiency improvement mostly arise the photoelectric conversion efficiency by refining the solar cell structure.

In addition, there are solar cells efficiency improvement made by using the lamination of the amorphous silicon thin layer and the microcrystalline silicon thin layer. However, since taking the electron-hole pairs to the electrodes uneasily and un-effectively, and the narrower absorbable wavelength range, it results in the ineffective conversion efficiency improvement of the amorphous silicon thin layer.

Therefore, how to increase fewer cost or not to complicate the manufacturing process, and the photoelectric conversion efficiency of the solar cell is increased are extremely important.

It is therefore attempted by the applicant to deal with the above situation encountered in the prior art.

SUMMARY OF THE INVENTION

In accordance with one aspect of the present invention, a method for improving photoelectric conversion efficiency in a solar cell is provided. The method includes a step being one selected from a group consisting of: (a) applying a mechanical stress to the solar cell; (b) generating a tension in the solar cell by at least two materials having respective lattice constants different from each other; (c) generating a tension in the solar cell by one selected from a group consisting of a shallow trench isolation filler, a high tensile/compressive stress silicon nitride layer and a combination thereof; and (d) a combination thereof.

Preferably, the method further generates a strain in the solar cell.

In accordance with another aspect of the present invention, a solar cell is provided. The solar cell includes: a body having a first surface and a second surface parallel to the first surface; and at least one gasket mounted on the second surface and supporting the body. The solar cell has a photoelectric conversion efficiency improved by applying a stress on the first surface, generating a supporting force on the second surface, and generating a strain in the solar cell.

Preferably, the solar cell has a material having a light-absorbent ability, generating electron-hole pairs, and generating a current by driving carriers in a built-in electric field.

Preferably, the solar cell has a structure selected from a group consisting of a P-N junction structure, a metal-insulator-semiconductor (MIS) structure, a quantum well structure, a quantum dot structure, a P-I-N photodiode structure and a combination thereof.

Preferably, the structure is one of a planar structure and a non-planar structure.

Preferably, the solar cell has a size selected from a group consisting of a five-inch, a six-inch, an eight-inch, a ten-inch, and a twelve-inch sizes.

Preferably, the solar cell has a size more than five inches.

Preferably, the solar cell has a size less than twelve inches.

Preferably, the solar cell has a size ranged between five inches to twelve inches.

In accordance with another aspect of the present invention, a method for improving a photoelectric conversion efficiency of a solar cell is provided. The method includes a first surface, a second surface parallel to the first surface and at least a gasket mounted on the second surface. The method includes steps of: (a) applying at least a stress on the first surface; (b) generating a supporting force on the second surface; and (c) generating at least a strain in the solar cell.

Preferably, the supporting force and the stress have respective directions opposite to each other.

Preferably, the supporting force and the stress have respective values, both of which are not higher than a critical value of fragmentation of the solar cell.

Preferably, the at least a strain is one selected from a group consisting of a tensile strain, a compressive stain and a combination thereof.

Preferably, the at least a strain is one selected from a group consisting of an uniaxial strain, a biaxial strain and a combination thereof.

Preferably, the at least a strain is larger than 0.01%, and the photoelectric conversion efficiency is absolutely increased more than 0.05%.

When the strain is generated in the solar cell, the carrier mobility is increased and the resistivity is reduced, so as to increase the fill factor. The photoelectric conversion efficiency then is arisen.

In addition, if the method that the gasket is mounted on the second surface of the solar cell and the stress is applied on the first surface thereof for generating the strain is adapted, the minor difference will be generated because of the incident angle of the light to the different areas of the first surface thereof. This difference might result in the decrease of the photocurrent. However, in consideration of the minor angle of the curved angel resulted from the strain, and the actual environment the solar cell utilized, the incident light not only comes from the sun, but also includes the scattered light resulted from sun through the air. The decrease of the short circuit current (Isc) is negligible. The whole photoelectric conversion efficiency is still increased because of the increased fill factor.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The strain technology of the present invention is applied in the solar cell, and the strain technology can be compatible with the original manufacture of the solar cell and reduces the difficulty of manufacturing integration to improve effectively photoelectric conversion efficiency of the solar cell.

The semiconductor material, such as silicon, will have a tensile strain or a compressive strain when the solar cell is subjected to stress. The carrier mobility of the solar cell is improved if the solar cell is subjected to the adequate external stress, the resistance thereof is reduced and the fill factor is increased by the appropriate strain. Further, the valence band and the conductive band of the silicon material will be split. Therefore, the energy gap of the semiconductor will be decreased and the light-absorbent wavelength range will be increased. Finally, the photoelectric conversion efficiency of the solar cell is improved.

Figure 1A:
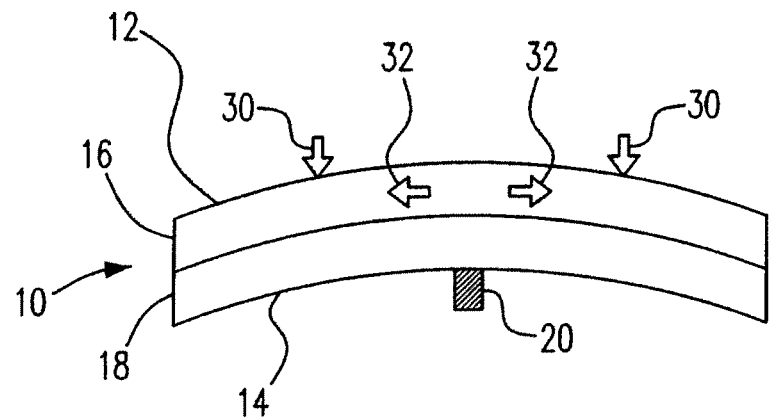
FIGS. 1(A) and 1(B) schematically illustrate the uniaxial tensile strain generated from the implemented uniaxial stress on the solar cell in accordance with a first embodiment of the present invention.
Figure 1B:
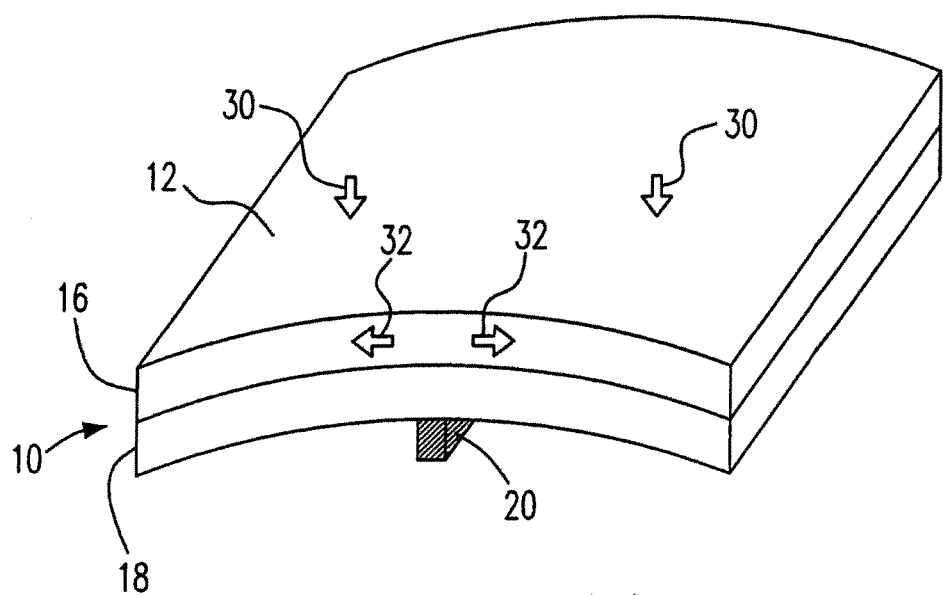

Please refer to FIGS. 1(A) and 1(B), which schematically illustrate the uniaxial tensile strain generated from the implemented uniaxial stress on the solar cell in accordance with a first embodiment of the present invention. In FIGS. 1(A) and 1(B), the solar cell having a P-N junction structure is adapted. For the convenient illustration, the solar cell is divided into the upper part 16 and the lower part 18, and a gasket is disposed on the second surface 14. While a downward uniaxial stress 30 is applied on the different sides of the first surface 12 according to the gasket 20 as the axis, the gasket 20 actually provides an upward supporting force, and the uniaxial stress 30 and the support force do not excess the critical value of fragmentation of the solar cell 10.

Figure 2A:
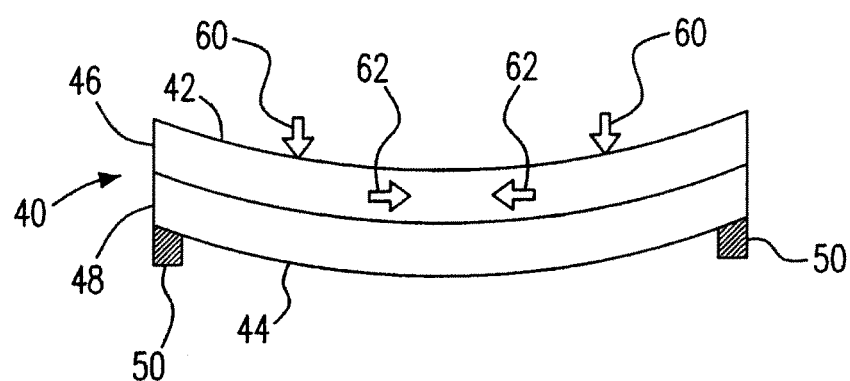
FIGS. 2(A) and 2(B) schematically illustrate the uniaxial compressive strain generated from the implemented uniaxial stress on the solar cell in accordance with a second embodiment of the present invention.
Figure 2B:
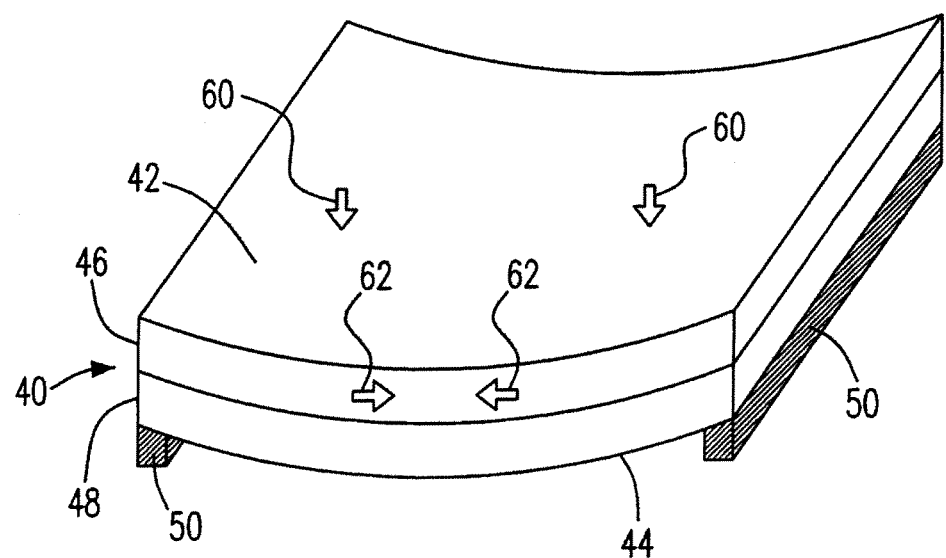

Please refer to FIGS. 2(A) and 2(B), which schematically illustrate the uniaxial compressive strain generated from the implemented uniaxial stress on the solar cell in accordance with a second embodiment of the present invention. In FIGS. 2(A) and 2(B), the solar cell is still divided into the upper part 46 and the lower part 48. Unlike FIGS. 1(A) and 1(B), two gaskets 50 in the second embodiment are respectively mounted on the opposite edges of the second surface 44 of the solar cell 40. A downward uniaxial stress 60 is implemented on the central region of the first surface 42 of the solar cell 40, the gaskets 50 provide the upward supporting force in practice. The uniaxial stress 60 and the supporting force do not exceed the critical value of fragmentation of the solar cell 40. The compressive strain 62 is formed inside the upper part 46 of the solar cell 40, and this compressive strain 62 is also named uniaxial compressive strain.

Figure 3A:
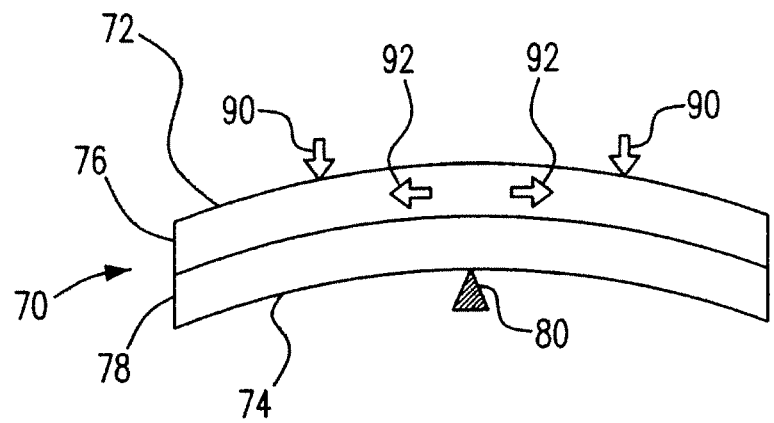
FIGS. 3(A) and 3(B) schematically illustrate the biaxial tensile strain generated from the implemented biaxial stress on the solar cell in accordance with a third embodiment of the present invention.
Figure 3B:
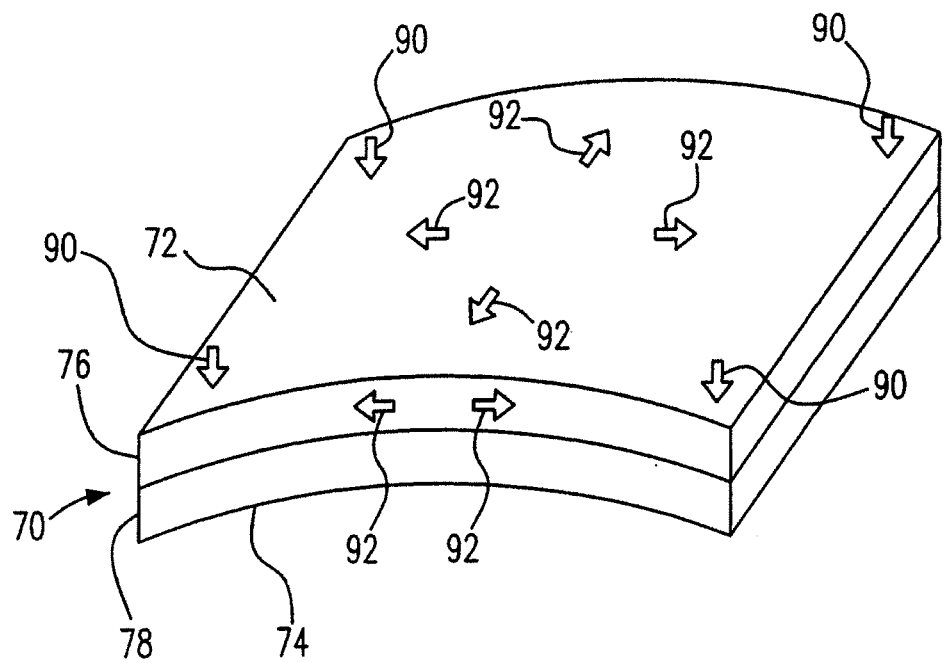

Please refer to FIGS. 3(A) and 3(B), which schematically illustrate the biaxial tensile strain generated from the implemented biaxial stress on the solar cell in accordance with a third embodiment of the present invention. In FIGS. 3(A) and 3(B), it is assumed that the squared solar cell 70 with the P-N junction structure is provided, and 76 and 78 are denoted as the upper part and the lower part of the solar cell 70 respectively. The bar-shaped gasket is substituted for a cone-shaped gasket 80 to be mounted on the center of the second surface 74. The downward biaxial stresses 90 are implemented perpendicular on the distinct four corners of the first surface 72 of the solar cell 70, and the outwardly-radial tensile strains 92 which is centered by the cone-shaped gasket 80 are formed interior the upper part 76 of the solar cell 70. This tensile strain 92 also can be named as the biaxial tensile strain.

It is known that the gasket is not limited in the bar-shape, cone-shape, circular shape or other shapes when the gasket is mounted on the different positions of the second surface of the solar cell. Further, the solar cell is not limited in the planar structure such as square, rectangle and circle, etc. Even the solar cell with the non-planar structure can be adapted. When the uniaxial and/or biaxial stress which does not exceed the critical value of fragmentation of the solar cell, the tensile strain, the compressive strain and the combination thereof will be generated inside the solar cell. These strains can be uniaxial strain, biaxial strain and the combination thereof.

In addition to the above-mentioned external stress applied on the solar cell to deform the solar cell and generate interior strain, the present invention also includes the lattice tension formed in the interface by the materials with two different lattice constants, and the material tension generated by other structures (such as cap) formed in the certain region of the solar cell, to generate strain in the solar cell. The concrete methods include shallow trench isolation filler, high tensile/ compressive stress silicon nitride layer and external mechanical strain, etc., and other methods for generating strain in the solar cell.

In addition to adapting the above-mentioned P-N junction structure, other solar cell structures are also adapted by absorbing light to generate the electron-hole pairs and driving carriers by the built-in electric field to generate current, such as metal-insulator-semiconductor (MIS) structure, quantum well, quantum dot and P-I-N photodiode structure, etc.

The size of the solar cell of the present invention for improving photoelectric efficiency can be 5, 6, 8, 10, or 12 inches, etc. Alternatively, the solar cell has the size is less than 5 inches, more than 12 inches, or ranged between 5 to 12 inches can be practiced according to the technology disclosed in the present invention.

Further, the generated strain distribution of the 6-inch silicon semiconductor to be the material of the solar cell is simulated by ANASYS numerical software. The thickness of silicon semiconductor is set the as 230 μm, and the thickness of the gasket is set as 2.2 mm. The tensile stain on the upper part is 0.1% when the stress is implemented on the first surface of silicon semiconductor to generate strain on the 6-inch silicon semiconductor. It is known that when a strain is generated on the silicon material, the carrier mobility and the fill factor can be increased, so as to improve the photoelectric conversion efficiency.

Figure 4:
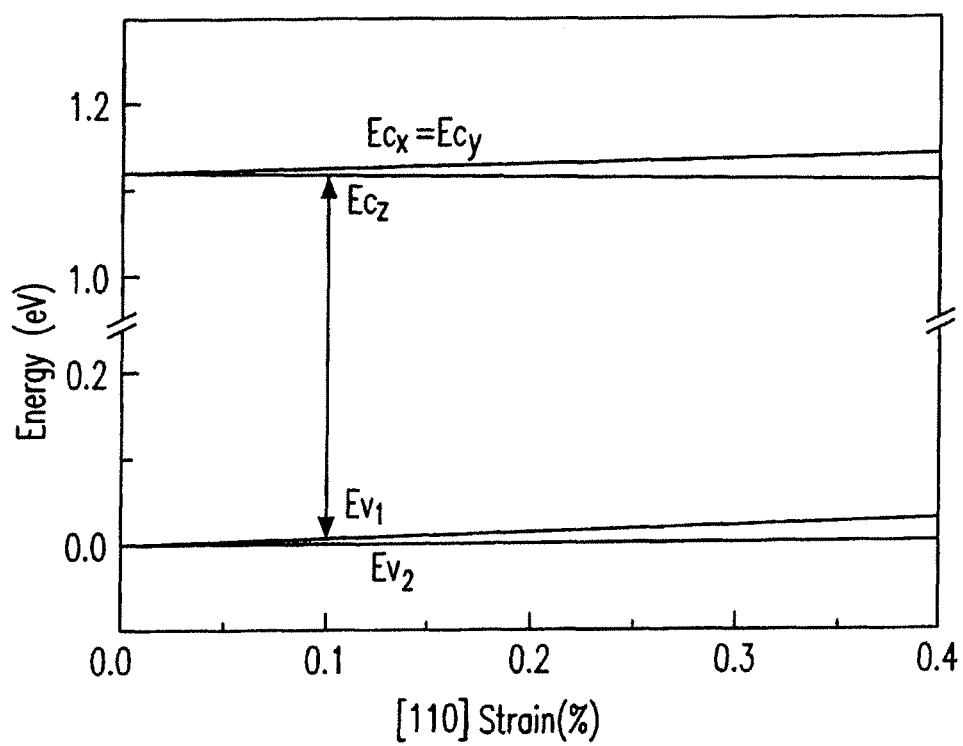
FIG. 4 is the variation of the bandgap as a function of strain while the stress is applied on the (001) wafer.

In addition, please refer to FIG. 4, which is the variation of the bandgap as a function of strain while the stress is applied on the (001) wafer. In accordance with the simulated calculation, the bandgap is decreased from 1.12 eV to 1.11 eV (i.e. from $Ev_1$ to $Ec_z$) when the (001) wafer is being the material and the strain of [110] direction (i.e. X-Y plane being the plane and the Z-axis being the normal direction) is 0.1%. Further, it is known in FIG. 4 that the higher strain generated in the [110] direction is increased with the decreased bandgap range (it means that the smaller distance from $Ev_1$ to $Ec_z$). This characteristic is beneficial for the solar cell efficiency improvement since the decreased bandgap enlarges the range of the absorbed optical band.

In the following example, the biaxial stress is implemented on the solar cell, for demonstrating that the solar cell generates stain to improve the photoelectric conversion efficiency.

Figure 5:
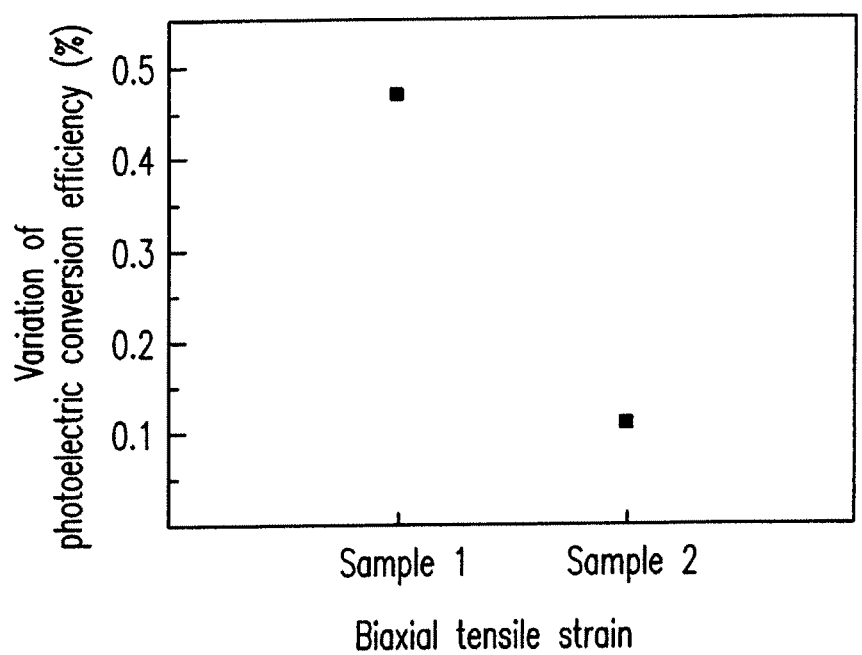
FIG. 5 is the relationship between the generated strain and the photoelectric conversion efficiency of the commercialized single crystalline silicon solar cell fragment which the stress is implemented thereon in accordance with the present invention.

The single crystalline solar cell fragment having 0.16 cm$^2$ of light-illuminated area is being the material, and the strain is implemented on the solar cell fragment. The configurations are shown in FIGS. 3(A) and 3(B). Please refer to FIG. 5, which is the relationship between the generated strain and the photoelectric conversion efficiency, of the commercialized signal crystal silicon solar cell fragment which the stress is implemented thereon in accordance with the present invention. In FIG. 5, when the biaxial tensile strain is generated in the solar cell fragment, the result is demonstrated that the photoelectric conversion efficiency of the solar cell fragment is increased to 0.463% of the absolute value.

The photoelectric conversion efficiency of the solar cell of the present invention can be effectively improved by implementing the stress to generate strain on the solar cell. Furthermore, the present invention can be easily integrated with the manufacturing process. All manufacturing processes of the original solar cell will be reserved if the mechanical structure or the fabrication is utilized to be the method for generating strain. The present invention further has advantage of low cost. The required cost will be extremely low if the mechanical structure or the fabrication is utilized to be the method for generating strain.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method of using a solar cell to improve the photoelectric conversion efficiency comprising the steps of:
    providing a planar, rigid solar cell with a first side and a second side;
    providing a gasket on the second side, wherein the gasket supports the planar, rigid solar cell;
    applying a mechanical force to the planar, rigid solar cell on the side opposite the gasket, wherein surfaces of the planar, rigid solar cell are rendered curvy;
    wherein the mechanical force induces a strain in the photoelectric conversion layer thereby improving the photoelectric conversion efficiency.

2. The method of using a solar cell according to claim 1, wherein the planar, rigid solar cell further comprises a material, and the material absorbs light that generates electron-hole pairs, and generates a current by driving a carrier in a built-in electric field.

3. The method of using a solar cell according to claim 1, wherein the planar, rigid solar cell has a structure selected from a group consisting of a P-N junction structure, a metal-insulator-semiconductor (MIS) structure, a quantum well structure, a quantum dot structure, a P-I-N photodiode structure and a combination thereof.

4. The method of using a solar cell according to claim 1, wherein the planar, rigid solar cell has a size selected from a group consisting of a five-inch, a six-inch, an eight-inch, a ten-inch, and a twelve-inch size.

5. The method of using a solar cell according to claim 1, wherein the solar cell has a size more than five inches.

6. The method of using a solar cell according to claim 1, wherein the solar cell has a size less than twelve inches.

7. The method of using a solar cell according to claim 1, wherein the solar cell has a size with a range between five inches to twelve inches.

* * * * *